US011484969B2

(12) United States Patent
Larsen

(10) Patent No.: US 11,484,969 B2
(45) Date of Patent: Nov. 1, 2022

(54) METHOD OF MAKING A THREE-DIMENSIONAL STRUCTURE CONTAINING SUBSTRUCTURES

(71) Applicant: 3M INNOVATIVE PROPERTIES COMPANY, St. Paul, MN (US)

(72) Inventor: Jeremy K. Larsen, Farmington, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 155 days.

(21) Appl. No.: 16/990,187

(22) Filed: Aug. 11, 2020

(65) Prior Publication Data

US 2021/0114138 A1 Apr. 22, 2021

Related U.S. Application Data

(60) Provisional application No. 62/923,020, filed on Oct. 18, 2019.

(51) Int. Cl.
*B23K 26/06* (2014.01)
*G03F 7/20* (2006.01)

(52) U.S. Cl.
CPC ...... *B23K 26/0648* (2013.01); *G03F 7/70375* (2013.01)

(58) Field of Classification Search
CPC ...... B33Y 10/00; B33Y 70/00; B23K 26/0648
See application file for complete search history.

(56) References Cited

U.S. PATENT DOCUMENTS 5,198,159 A * 3/1993 Nakamura ............ B29C 64/135 365/107
7,118,845 B2 10/2006 DeVoe
7,265,161 B2 9/2007 Leatherdale
10,118,376 B2 11/2018 Reiner
2012/0218535 A1 8/2012 Thiel
2016/0332365 A1 11/2016 Reiner

FOREIGN PATENT DOCUMENTS

EP 3266594 A1 * 1/2018 ........... B29C 64/135

* cited by examiner

*Primary Examiner* — Thien S Tran
(74) *Attorney, Agent, or Firm* — Adrian L. Pishko

(57) ABSTRACT

A method of making a three-dimensional structure including substructures is provided. The method includes directing laser light from a microscope objective through a photopolymerizable material to form a plurality of substructures each having at least one vertical wall directly attached to a vertical wall of an adjacent substructure. The substructures are individually formed in a sequence such that any second substructure that is formed in a location vertically disposed between the microscope objective and a first substructure has a wall that extends horizontally a shorter distance than a wall of the first substructure if a third substructure will subsequently be formed directly attached to the wall of the first substructure. The method is useful for minimizing passing laser light through a portion of an already formed substructure during formation of the three-dimensional structure.

14 Claims, 13 Drawing Sheets

310
320
L
2w
2
3
1
1w
$D_H$

METHOD OF MAKING A THREE-DIMENSIONAL STRUCTURE CONTAINING SUBSTRUCTURES

BACKGROUND

A common problem when forming structures using multiphoton lithography is clipping of the laser light beam when working in too close of proximity to a previously formed substructure. With typical photopolymerizable formulations, laser absorption causes a change in the material as it crosslinks, and associated with that process is a change in refractive index of the material. When the laser light beam passes through an area with non-uniform refractive indices, the beam is refracted, and as a result the energy at the focal point is diminished. The end effect tends to be incomplete curing of the next substructure, worsening near the base, and improving towards the top of the substructure as the clipping is reduced. One way to solve this problem is described in U.S. Pat. No. 10,118,376 (Reiner et al.), in which interfaces between partial structures run obliquely with respect to the principal direction of the structure entry. There remains a need to solve this problem without requiring angled interfaces.

SUMMARY

In a first aspect, a method of making a three-dimensional structure including a plurality of substructures is provided. The method includes directing laser light from a microscope objective through a photopolymerizable material to form a plurality of substructures each having at least one vertical wall directly attached to a vertical wall of an adjacent substructure. The substructures are individually formed in a sequence such that any second substructure that is formed in a location vertically disposed between the microscope objective and a first substructure has a wall that extends horizontally a shorter distance than a wall of the first substructure if a third substructure will subsequently be formed directly attached to the wall of the first substructure.

Exemplary embodiments of methods described herein can be used to avoid light clipping issues when forming features in close proximity to one another that otherwise could lead to incomplete structure dosing.

Figure 1A:
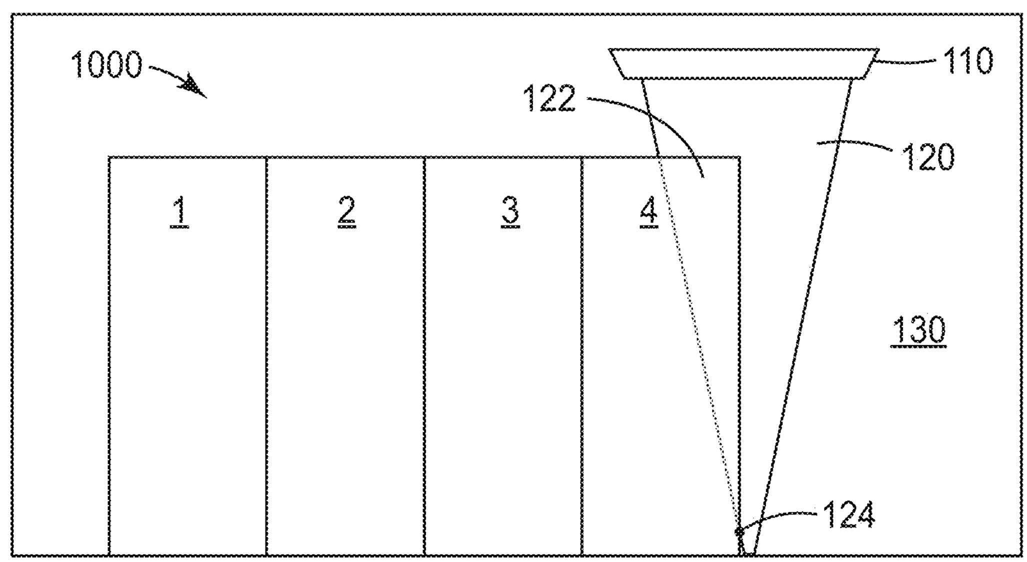
FIG. 1A is a schematic side view of forming a three-dimensional structure.

While the above-identified figures set forth several embodiments of the disclosure, other embodiments are also contemplated, as noted in the description. The figures are not necessarily drawn to scale. Not every feature is illustrated in each figure. In all cases, this disclosure presents embodiments by way of representation and not limitation. It should be understood that numerous other modifications and embodiments can be devised by those skilled in the art, which fall within the scope and spirit of the principles of the present disclosure.

DETAILED DESCRIPTION

Glossary

As used herein, the term "substructure" refers to one of a plurality of discrete parts that make up a larger structure.

As used herein, the term "structure" refers to a photopolymerized article.

As used herein, a "photopolymerizable material" refers to a composition that includes at least one component that is polymerizable by actinic radiation. The term "component" encompasses compounds, monomers, oligomers, and polymers. A "polymerizable component," for reference purposes herein, comprises a hardenable component that can be cured to provide an article. Hardening often comprises irradiating with actinic radiation having sufficient energy to initiate a polymerization or cross-linking reaction and thereby form an at least partially photopolymerized material. For instance, in some embodiments, ultraviolet (UV) radiation, e-beam radiation, or both, can be used.

As used herein, "curing" means the hardening or partial hardening of a composition by any mechanism, e.g., by heat, light, radiation, e-beam, microwave, chemical reaction, or combinations thereof. As used herein, the term "hardenable" refers to a material that can be cured or solidified, e.g., by heating to remove solvent, heating to cause polymerization, chemical crosslinking, radiation-induced polymerization or crosslinking, or the like. As used herein, "cured" refers to a material or composition that has been hardened or partially hardened (e.g., polymerized or crosslinked) by curing. A hardened or cured material is insoluble in the remaining uncured photopolymerizable composition. The methods described herein comprise multiphoton curing.

As used herein, "multiphoton absorption" means the simultaneous absorption of two or more photons of light to reach a photoreactive, electronic excited state that is energetically inaccessible by the absorption of a single photon of the same energy.

As used herein, "multiphoton absorber" means a species capable of undergoing multiphoton absorption of light.

As used herein, "clipping" means incomplete curing of an area of a substructure due to the optical interference of a previous substructure, resulting in a gap in the substructure or incomplete substructure formation.

As used herein, "light" means electromagnetic radiation having a wavelength in a range of from about 300 to about 1500 nm.

As used herein, "liquid" refers to a composition that is in a liquid state at one atmosphere of pressure and at least one temperature in the range of from 20-25° Celsius, inclusive.

As used herein, "numeric aperture" means the product of the index of refraction of the object medium multiplied by the sine of the slope angle of the outermost ray from an axial point on the object.

As used herein, "optical entrance" refers to the end of a microscope objective where the light beam has parallel light rays.

As used herein, "optical exit" refers to the end of a microscope objective where the light beam converges.

As used herein, a "photochemically effective amount" means an amount sufficient to enable the photoreactive species to undergo at least partial reaction under the selected exposure conditions (as evidenced, e.g., by a change in density, viscosity, color, pH, refractive index, or other physical or chemical property).

As used herein, "simultaneous" means two events that occur within the period of $10^{-14}$ seconds or less.

As used herein, "solvent" refers to a nonreactive liquid component of a composition that dissolves at least one solid component, or dilutes at least one liquid component, of the composition (in the case of water, adventitious amounts of water are not included by the term "solvent").

Figure 3A:
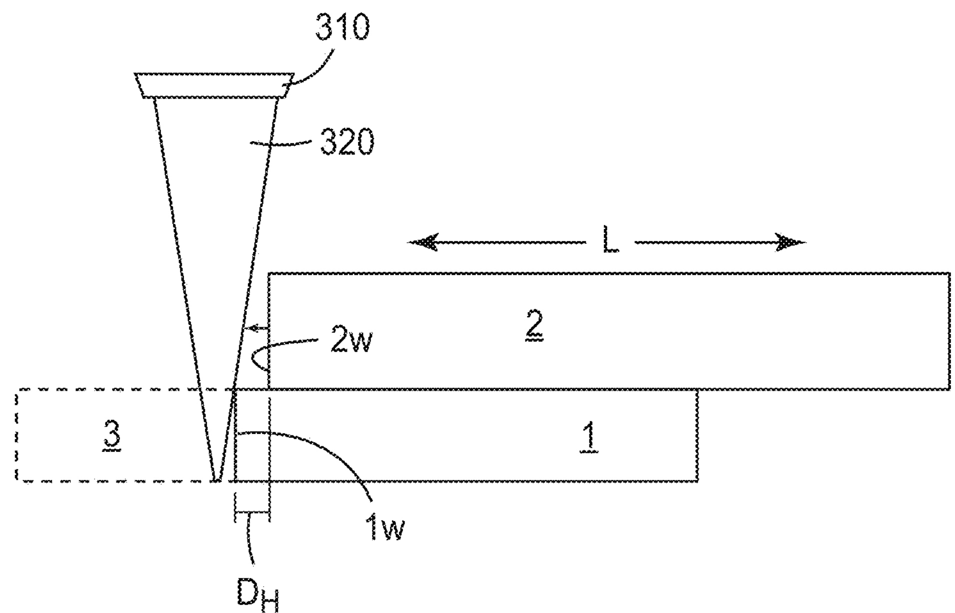
FIG. 3A is schematic side view of two substructures and laser light directed from a microscope objective, according to an exemplary method of the present disclosure.

As used herein, "vertically disposed between" refers to the relative spatial arrangement of at least three objects, in which at least one object is located above another object and below an additional object. The at least three objects are not necessarily exactly vertically aligned; rather, at least one of the objects may vary in location on a horizontal plane (i.e., the horizontal plane is orthogonal to the vertical direction). For example, FIG. 3A shows a substructure 2 that is vertically disposed between a microscope objective 310 and a substructure 1; however, the substructure 2 is almost entirely disposed to the right horizontally of the microscope objective 310.

As used herein, "a wall that extends horizontally" with respect to a substructure refers to a length to which a major surface of the substructure reaches in a horizontal direction.

Figure 1B:
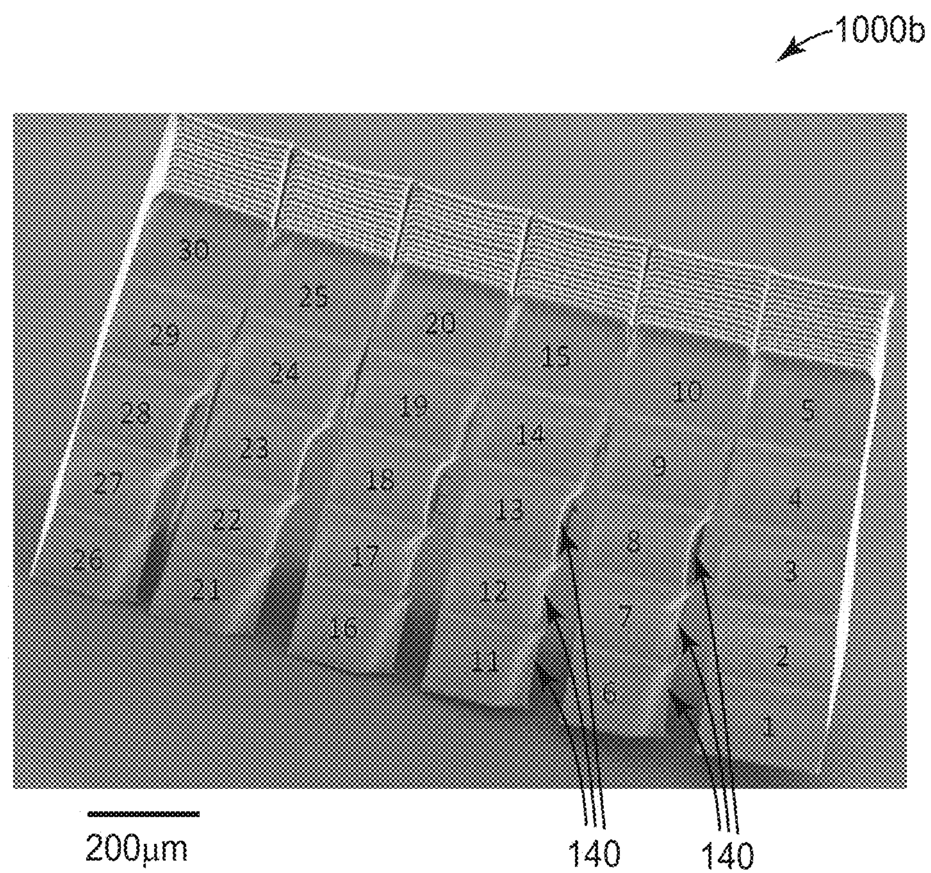
FIG. 1B is a scanning electron microscopy (SEM) image of the structure of Comparative Example 1.

A common problem when forming structures using multiphoton lithography is clipping of the laser light beam when working in too close of proximity to a previously formed substructure, particularly a high aspect substructure (e.g., a height to width ratio of greater than 1:1, greater than 1.5:1, or preferably greater than 2:1). Referring to FIG. 1A, a schematic side view is provided of a structure 1000 formed of four substructures 1 through 4, numbered in order of their formation. FIG. 1A illustrates the problematic issue of clipping of the laser light beam when working too near to a previously formed substructure, namely beginning to form a substructure directly adjacent to substructure 4. A microscope objective 110 and its laser beam 120 having a focal point 124 are shown, as well as an area 122 where a refractive index of the material of the substructure 4 is different than a refractive index of the surrounding photopolymerizable material 130. As noted above, the end effect tends to be incomplete curing of the next substructure, worsening near the base, and improving towards the top of the substructure as the clipping is reduced. Referring to FIG. 1B, a scanning electron microscopy image (SEM) is provided of a structure 1000*b* formed having substructures 1 through 30 (numbered in order of their formation) formed directly adjacent to each other and having clipped regions 140 on each of substructures 6 through 9, 11 through 14, 16 through 19, 21 through 24 and 26 through 29, where each of the substructures experienced incomplete curing.

It has been discovered that it is possible to minimize clipping of the laser light beam when working in close proximity to a previously formed substructure by forming substructures in a particular order based on their relative locations. Advantageously, it is possible to form substructures having vertical attached walls with minimal to no clipping using methods according to the present disclosure. The final article can have a wide variety of shapes of a three-dimensional structure formed from a plurality of substructures.

In a first aspect, a method of making a three-dimensional structure is provided. The method comprises:

directing laser light from a microscope objective through a photopolymerizable material to form a plurality of substructures each having at least one vertical wall directly attached to a vertical wall of an adjacent substructure;

wherein the substructures are individually formed in a sequence such that any second substructure that is formed in a location vertically disposed between the microscope objective and a first substructure has a wall that extends horizontally a shorter distance than a wall of the first substructure if a third substructure will subsequently be formed directly attached to the wall of the first substructure.

For use in multiphoton imaging processes using liquid photopolymerizable compositions, the numerical aperture (NA) of a microscope objective is preferably at least 1.0, more preferably at least 1.2, and more preferably at least 1.4, although other numerical apertures may be used, if desired. Microscope objectives (also known as microscope objective lenses) are well-known in the art and are commercially available from numerous sources including, for example: Carl Zeiss Microscopy, LLC, Thornwood, N.Y. (e.g., microscope objectives marketed as OBJECTIVE ALPHA PLAN-APOCHROMAT 100×/1.46 OIL DIC M27, OBJECTIVE ANTIFLEX EC PLAN-NEOFLUAR 63×/1.25 OIL PH3 M27, OBJECTIVE ALPHA PLAN-APOCHROMAT 100×/1.57 OIL-HI DIC CORR M27, ZEISS 40×/1.0 OIL IRIS MICROSCOPE OBJECTIVE (NA=1.0) and OBJECTIVE ALPHA PLAN-APOCHROMAT 100×/1.46 OIL IRIS M27); Nikon Instruments Inc., Melville, N.Y. (e.g., microscope objectives marketed as PLAN 100× W (NA=1.1), CFI S FLUOR 40× OIL (NA=1.30), and CFI S FLUOR 100× OIL (NA=0.5-1.3)); and Olympus Corp., Tokyo, Japan (e.g., microscope objectives marketed as M PLAN APOCHROMAT MPLAPON100XO (NA=1.4)).

In general, liquid photopolymerizable compositions suitable for the methods of the present disclosure comprise a multiphoton absorbing compound (multiphoton absorber) in combination with at least one polymerizable compound. In multiphoton stereolithographic processes, laser light is directed through the microscope objective and into photopolymerizable composition in an image-wise manner under conditions such that multiphoton absorption by the multiphoton absorber, and at least partial polymerization of the polymerizable compound occurs, resulting in a structure. Removal of uncured photopolymerizable composition, typically with solvent, reveals the fabricated structure.

Details concerning materials and methods suitable for multiphoton stereolithography using photopolymerizable compositions (e.g., liquid photoresists) are described in, for example, U.S. Pat. Appl. Publ. No. 2012/0218535 (Thiel et al.). Typically, liquid photoresists suitable for conventional one-photon stereolithography (an additive manufacturing process which employs a vat of liquid ultraviolet curable photopolymer resin and an ultraviolet laser to build structures by stepwise formation of layers, one on top of another) can be adapted for use as liquid photopolymerizable compositions for multiphoton imaging by replacing the initiator/sensitizer component(s) with ones suitable for multiphoton (e.g., two-photon) imaging. Additional details can be found in the examples included hereinbelow. General information concerning materials and methods for practicing multiphoton stereolithography can be found, for example, in U.S. Pat. No. 7,118,845 (DeVoe et al.).

Figure 2A:
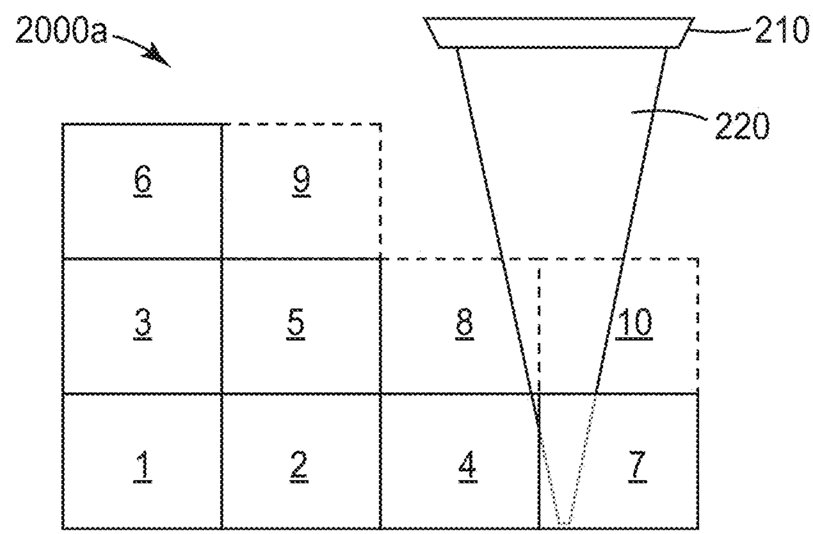
FIG. 2A is a schematic side view of a three-dimensional structure according to an exemplary method of the present disclosure.
Figure 2B:
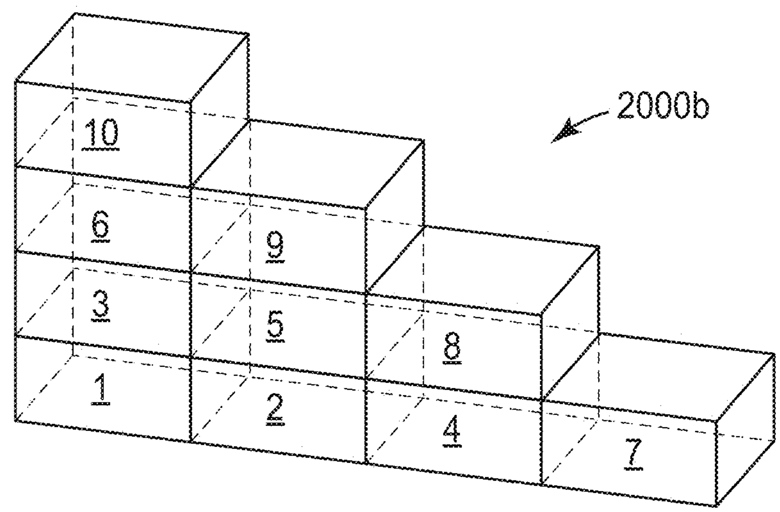
FIG. 2B is a schematic perspective view of another three-dimensional structure according to an exemplary method of the present disclosure.

One way to describe methods according to at least certain embodiments of the present disclosure is as a bricklaying progression. For instance, referring to FIG. 2A, the order in which seven substructures 1 to 7 of structure 2000*a* were formed is indicated by the numbers on each substructure. A microscope objective 210 and its laser beam 220 are also shown. Further, the structure is designed to include three additional substructures 8 to 10 formed in the order shown in FIG. 2A. Similarly, referring to FIG. 2B, FIG. 2B shows a three-dimensional structure 2000*b* comprising ten substructures. The structure 2000*b* has a linear bricklaying design with substructures formed in the order of the numbering of the substructures 1 through 10 to minimize clipping. For instance, the substructure 4 was formed prior to the substructure 5 because the substructure 5 is located vertically disposed between a microscope objective (not shown) during formation of the substructure 4 and the structure 2000*b* was designed to include the substructure 7 attached to the vertical wall of the substructure 4.

FIG. 3A shows a second substructure 2 that is vertically disposed between a microscope objective 310 and a first substructure 1 and the second substructure 2 is almost entirely disposed to the right horizontally of the microscope objective 310. In the embodiment in FIG. 3A, it is shown that it is not necessary for the total length L in the horizontal direction of the second substructure 2 to be shorter than the total length L of the first substructure 1 in the horizontal direction as long as there is a distance (e.g., $D_H$) between a wall $\mathbf{2}_w$ of the second substructure 2 and a wall $\mathbf{1}_w$ of the first substructure 1 to which a third substructure 3 is to be subsequently formed (e.g., by direction of a laser light 320 from a microscope objective 310). Some exterior walls of the third substructure 3 are indicated using a dashed line. Stated another way, the total size of a footprint of the substructure 2 is not important to avoid forming a substructure directly adjacent to two stacked substructures as long as the relative wall location requirement is met.

Figure 3B:
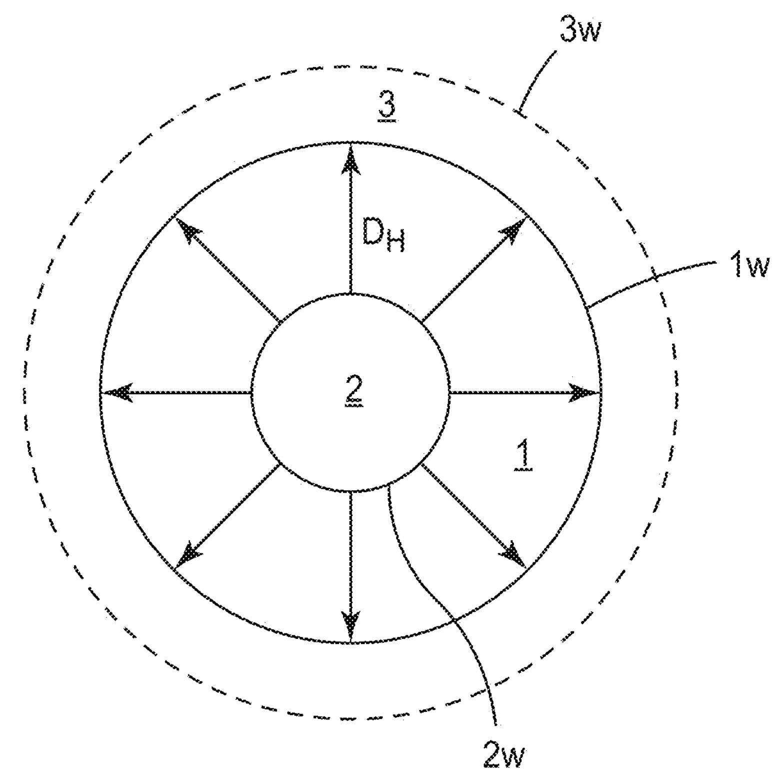
FIG. 3B is schematic top view of two cylindrical substructures according to an exemplary method of the present disclosure.
Figure 3C:
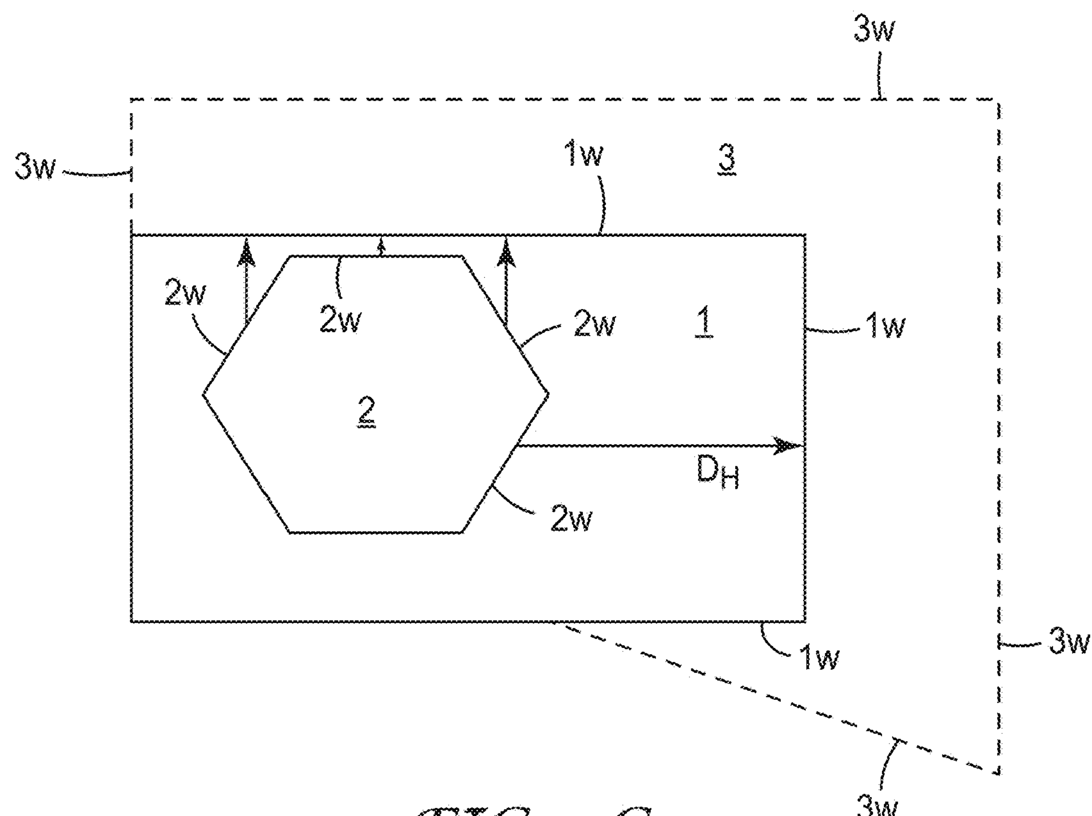
FIG. 3C is a schematic top view of two substructures having different shapes according to an exemplary method of the present disclosure.

Although FIGS. 1 and 2 show cuboid shaped substructures, numerous different shapes of substructure may be formed to make a particular structure. For instance, referring to FIG. 3B, a top view is provided of a first substructure 1 and a second substructure 2 disposed (vertically) on top of the first substructure 1, wherein each of the first substructure 1 and the second substructure 2 comprises a cylindrical shape. At least one horizontal distance $D_H$ is provided between the curved wall $\mathbf{2}_w$ of the substructure 2 and the curved wall $\mathbf{1}_w$ of the first substructure at least because a third substructure 3 (designed to have a curved wall $\mathbf{3}_w$ indicated by a dashed line) will be formed directly attached to the wall 1*w* of the first substructure 1. Similarly, referring to FIG. 3C, a top view is provided of a first substructure 1 having a cuboid shape and a second substructure 2 having a hexagonal prismatic shape disposed (vertically) on top of the first substructure 1. A plurality of horizontal distances $D_H$ are provided between the walls $\mathbf{2}_w$ of the second substructure 2 and the walls $\mathbf{1}_w$ of the first substructure 1 at least because a third substructure 3 (designed to have a plurality of walls $\mathbf{3}_w$ indicated by a dashed line) will be formed directly attached to some of the walls $\mathbf{1}_w$ of the first substructure 1. In select embodiments, any of a first substructure, second substructure, and/or third substructure has a cuboid shape, a cylindrical shape, a hexagonal prismatic shape, or a triangular prismatic shape.

Figure 4A:
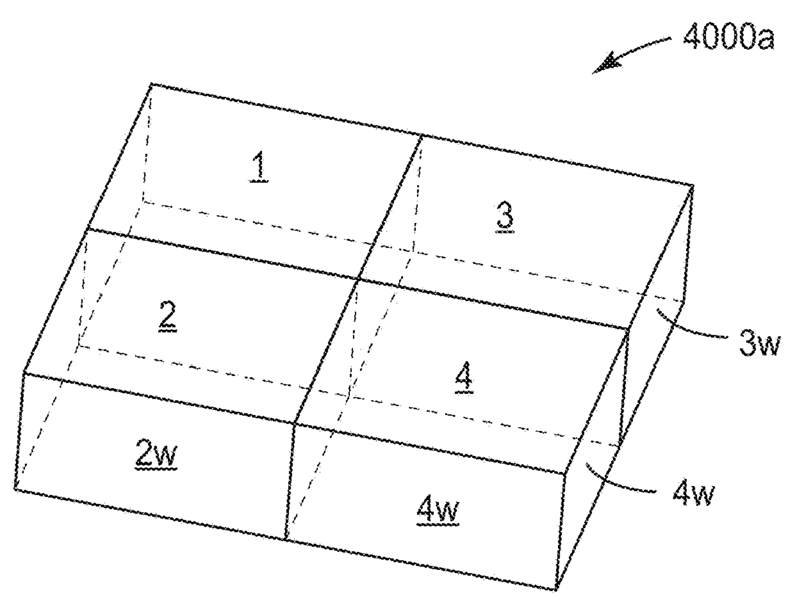
FIG. 4A is a schematic perspective view of four attached substructures of a three-dimensional structure according to the present disclosure.
Figure 4B:
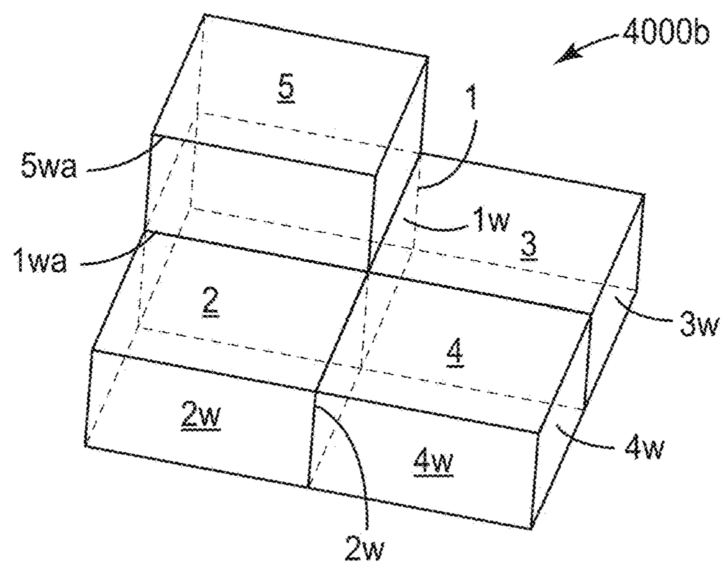
FIG. 4B is a schematic perspective view of the structure of FIG. 4A further comprising a fifth substructure.
Figure 4C:
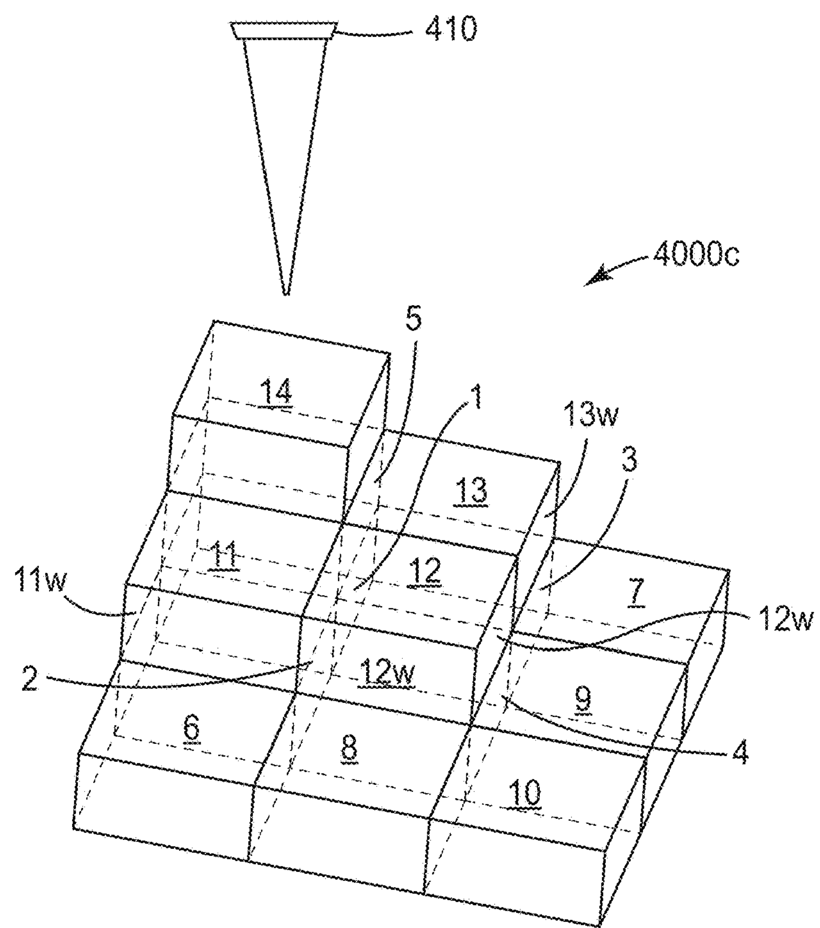
FIG. 4C is a schematic perspective view of a three-dimensional structure comprising the structure of FIG. 4B and nine additional attached substructures according to an exemplary method of the present disclosure.

Referring to FIG. 4A, a schematic perspective view is provided of four attached substructures of a three-dimensional structure 4000*a*, in which the substructures 1 through 4 are numbered in order of their formation using multiphoton lithography of a photopolymerizable composition. FIG. 4B shows the structure 4000*a* of FIG. 4A that further comprises a substructure 5 disposed directly vertically adjacent to the substructure 1, thereby forming a three-dimensional structure 4000*b*. FIG. 4C is a three-dimensional structure 4000*c* comprising the structure 4000*b* of FIG. 4B that further comprises nine additional attached substructures, substructures 6 through 14. Hence, in some embodiments, the method comprises forming at least one substructure of the second layer prior to completing a final substructure of the first layer. The numbering of the substructures 6-14 also corresponds to the order in which each was formed on the three-dimensional structure 4000*c*. In alternate embodiments, the order of formation of the substructures 6 through 10 could be rearranged without affecting the final structure 4000*c* (for instance, the order of formation of these substructures could have been 7, 9, 10, 8, and then 6).

Referring to both FIGS. 4B and 4C, in the three-dimensional structure 4000*c*, however, it is important that each of substructures 6 through 10 be formed prior to forming any of substructures 11, 12, or 13. This is because none of the substructures 2, 4, or 3 have walls $\mathbf{2}_w$, $\mathbf{4}_w$, and $\mathbf{3}_w$, respectively, that extend horizontally a longer distance than the horizontal distance to which the walls $\mathbf{11}_w$, $\mathbf{12}_w$, or $\mathbf{13}_w$ of the substructures 11, 12, or 13 extend, respectively; substructures 11 through 13 are vertically disposed between the substructures 2 through 4 and the microscope objective 410; and substructures 6 through 10 were formed after and directly attached to walls of the substructures 2 through 4. On the other hand, if the substructures 6 through 10 had been formed after forming any of substructures 11 through 13, each of substructures 6 through 10 would be expected to have clipped portions due to the presence of the substructures 11 through 13 directly adjacent to the vertical walls of substructures 6 through 10. In contrast, because the final structure 4000*c* is designed for the substructure 1 to be disposed at an edge of a major surface of the structure, the substructure 5 can be formed having a wall $\mathbf{5}_{wa}$ that extends the same distance horizontally as a wall $\mathbf{1}_{wa}$ located directly vertically below the wall $\mathbf{5}_{wa}$. As such, in select embodiments, a first substructure is located at an edge of a major surface of the (final) structure. Often, at least one vertical wall $\mathbf{4}_w$ of a substructure (e.g., the substructure 4) has a height that is the same as the vertical wall $\mathbf{3}_w$ of a directly attached adjacent substructure (e.g., the substructure 3).

Figure 5A:
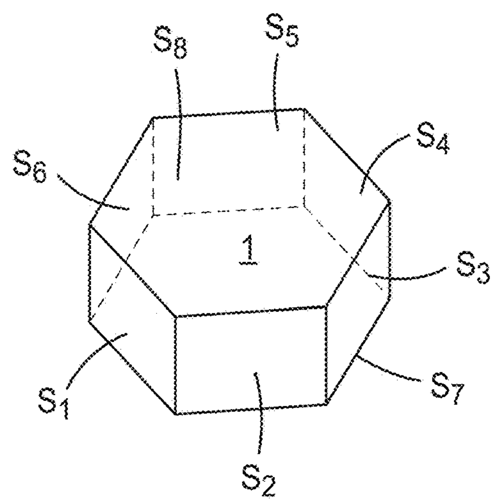
FIG. 5A is a schematic perspective view of a substructure having a hexagonal prism shape, according to the present disclosure.
Figure 5B:
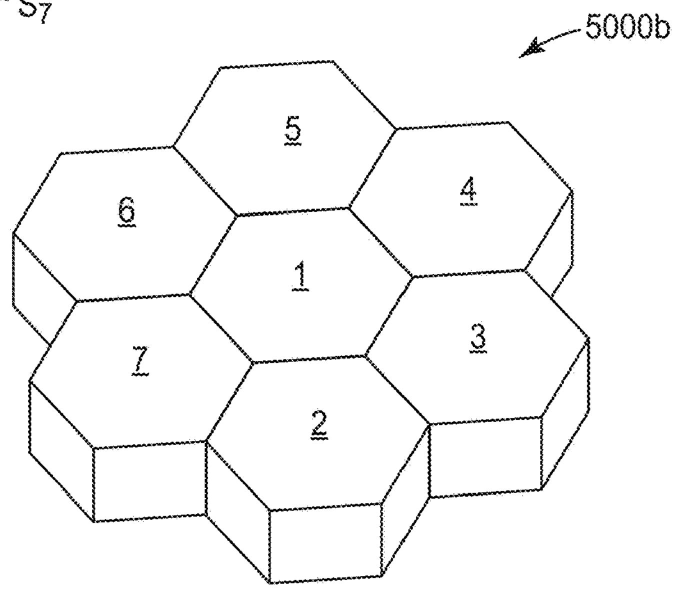
FIG. 5B is a schematic perspective view of seven attached substructures of a three-dimensional structure according to the present disclosure.
Figure 5C:
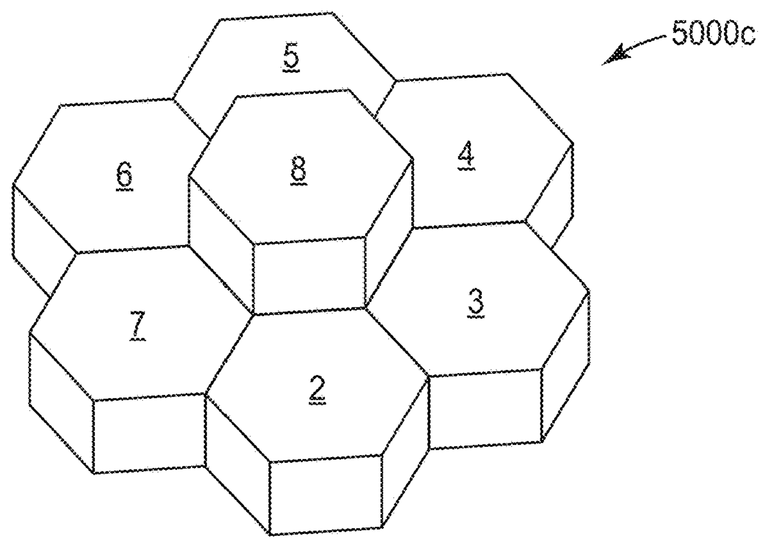
FIG. 5C is a schematic perspective view of the structure of FIG. 5B further comprising an eighth substructure, according to an exemplary method of the present disclosure.
Figure 5D:
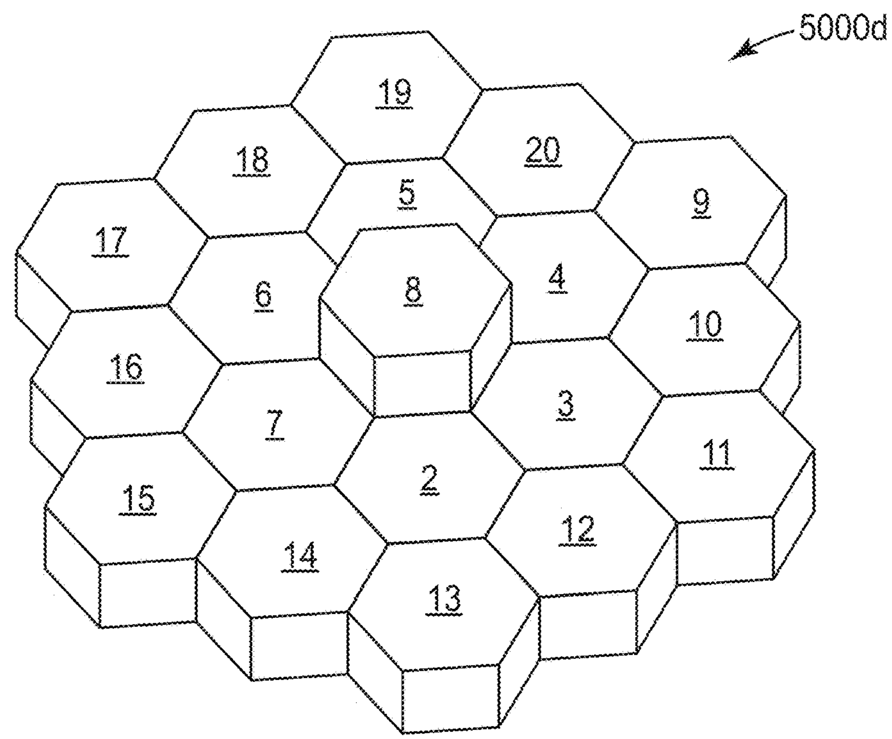
FIG. 5D is a schematic perspective view of the structure of FIG. 5C further comprising twelve additional attached substructures, according to an exemplary method of the present disclosure.
Figure 5E:
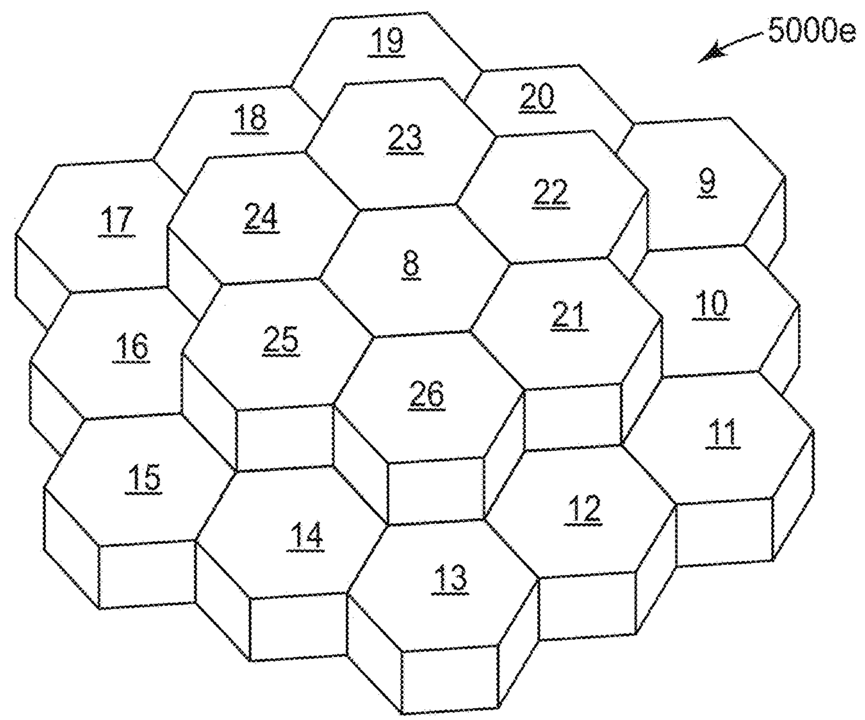
FIG. 5E is a schematic perspective view of an exemplary three-dimensional structure comprising the structure of FIG. 5D and six additional attached substructures, according to an exemplary method of the present disclosure.
Figure 5F:
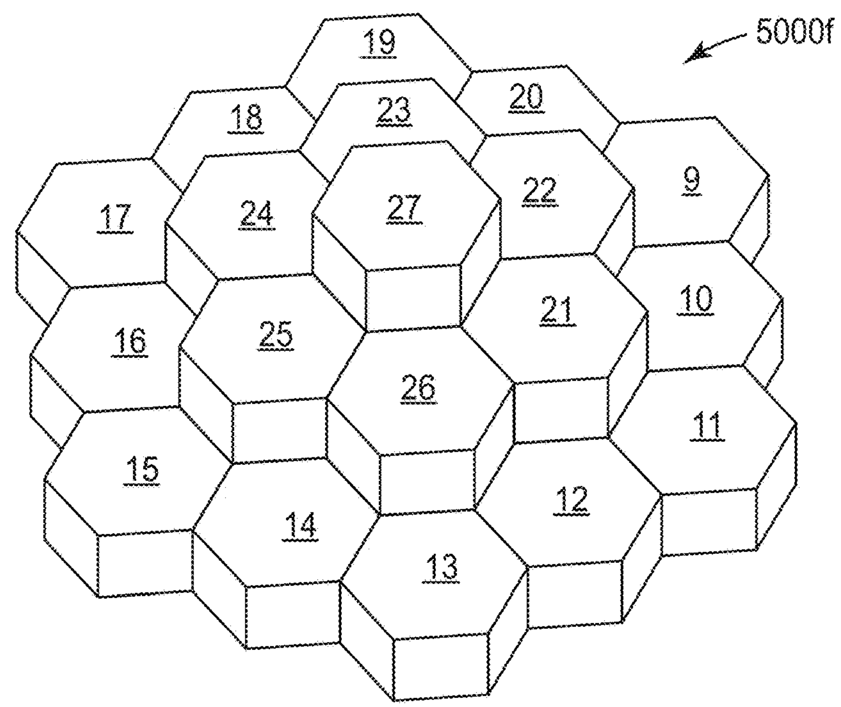
FIG. 5F is a schematic perspective view of an exemplary three-dimensional structure comprising the structure of FIG. 5E and one additional attached substructure, according to an exemplary method of the present disclosure.

Referring to FIGS. 5A-5E, FIG. 5A shows a first substructure 1 having a hexagonal prismatic shape. The first substructure 1 comprises 8 major surfaces $S_1$ through $S_8$. In some embodiments of structures according to the present disclosure, the first substructure 1 comprises at least three major surfaces, at least four major surfaces, at least five major surfaces, at least six major surfaces, at least seven major surfaces, or at least eight major surfaces. FIG. 5B shows seven attached substructures of a three-dimensional structure 5000*b*, in which the substructures 2 through 7 are attached to the vertical walls of the first substructure 1, surrounding the first substructure 1. In certain embodiments, the first substructure is located at substantially a center of a major surface of the structure. FIG. 5C shows a three-dimensional structure 5000*c* comprising the structure 5000*b* of FIG. 5B and further comprising an eighth substructure 8 disposed on top of a major surface of the first substructure 1. FIG. 5D shows a three-dimensional structure 5000*d* comprising the structure 5000*c* of FIG. 5C and further comprising twelve additional substructures (i.e., substructures 9 through 20) attached to the vertical walls of the substructures 2 through 7. FIG. 5E shows a three-dimensional structure 5000*e* comprising the structure 5000*d* of FIG. 5D and further comprising six additional substructures (i.e., substructures 21 through 26) attached to the vertical walls of the eighth substructure 8, surrounding the eighth substructure 8. FIG. 5F shows a three-dimensional structure 5000*f* comprising the structure 5000*e* of FIG. 5E and further comprising a twenty-seventh substructure 27 disposed on top of a major surface of the eighth substructure 8. Accordingly, per the exemplary methods of making a three-dimensional structure according to the present disclosure, the substructures 9 through 20 were formed prior to the substructures 21 through 26 to minimize clipping during formation of the substructures 9 through 20 due to the presence of the substructures 21 through 26 that are located vertically disposed between a microscope objective (not shown) during formation and the substructures 2 through 7.

Figure 6A:
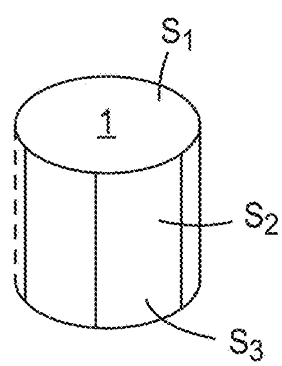
FIG. 6A is a schematic perspective view of a substructure having a cylindrical shape, according to the present disclosure.
Figure 6B:
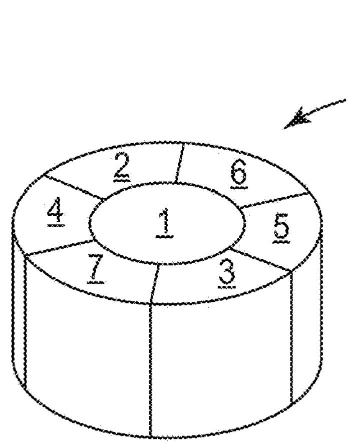
FIG. 6B is a schematic perspective view of seven attached substructures of a three-dimensional structure according to the present disclosure, including the substructure of FIG. 6A.
Figure 6C:
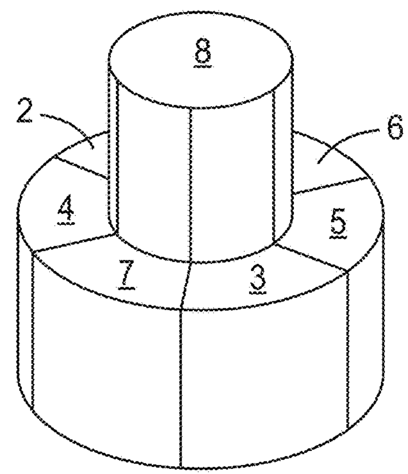
FIG. 6C is a schematic perspective view of the structure of FIG. 6B further comprising an eighth substructure, according to an exemplary method of the present disclosure.
Figure 6D:
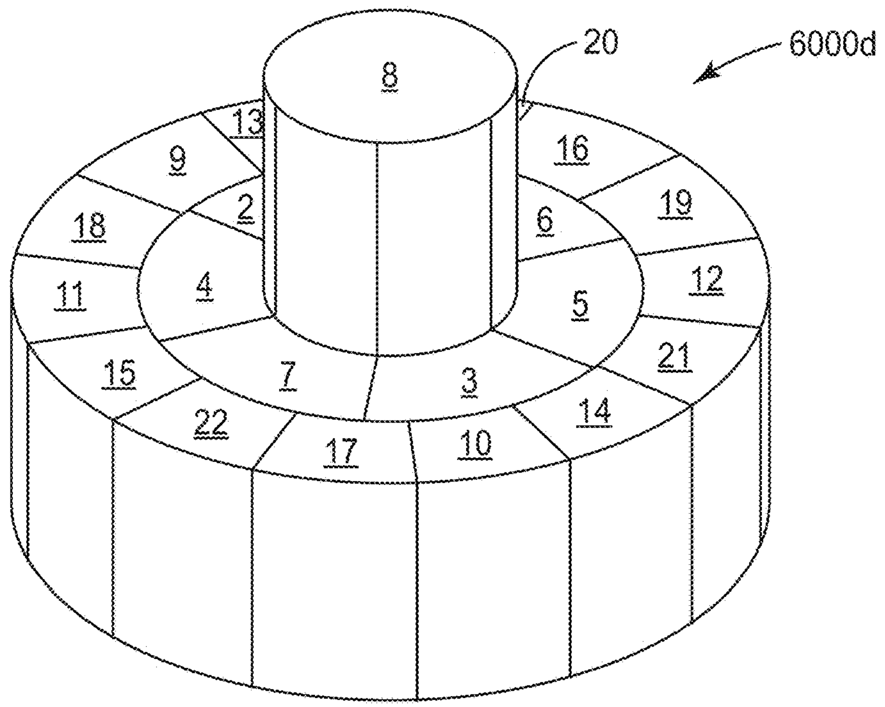
FIG. 6D is a schematic perspective view of the structure of FIG. 6C further comprising fourteen additional attached substructures, according to an exemplary method of the present disclosure.
Figure 6E:
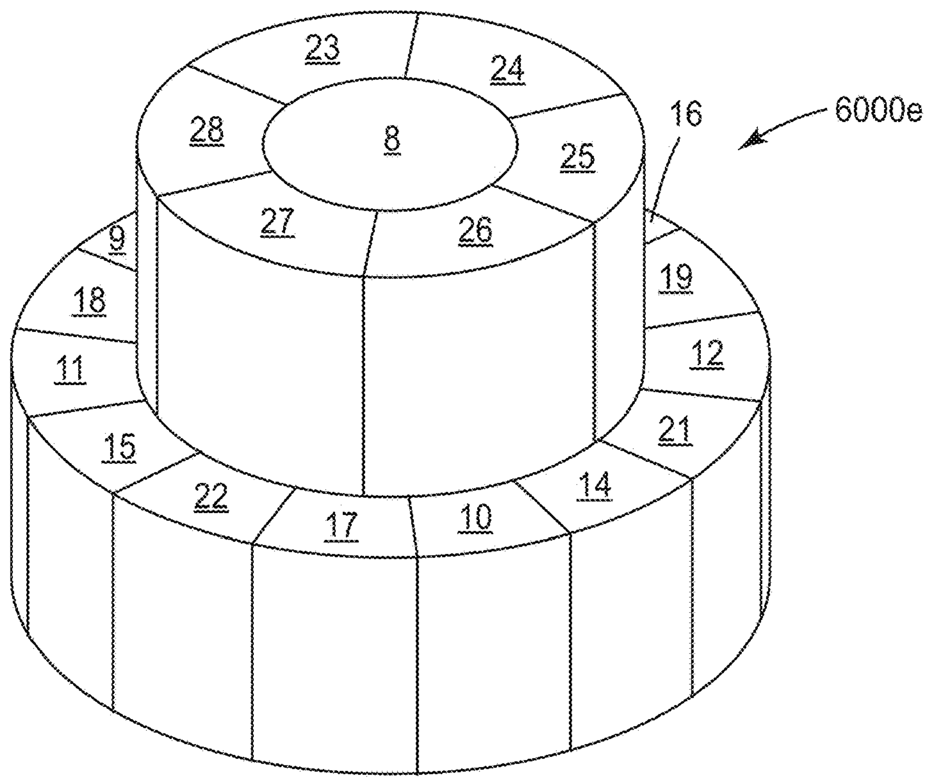
FIG. 6E is a schematic perspective view of a three-dimensional structure comprising the structure of FIG. 6D and six additional attached substructures, according to an exemplary method of the present disclosure.
Figure 6F:
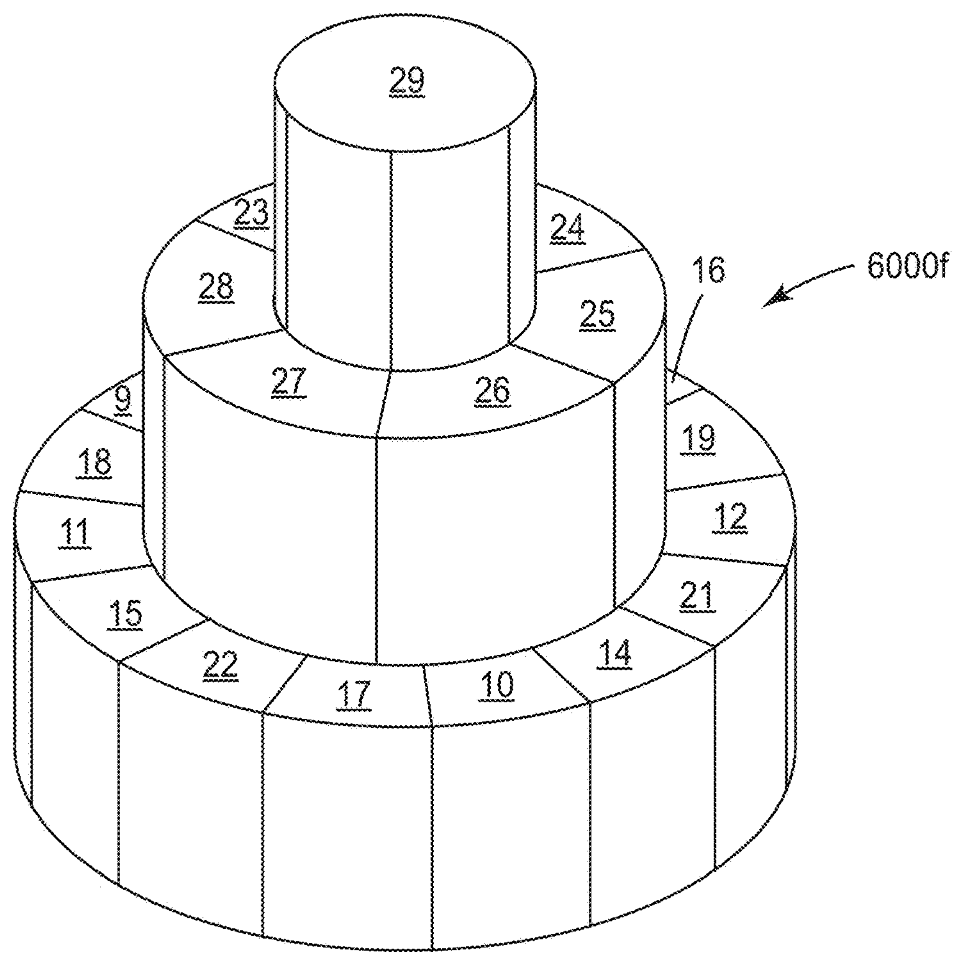
FIG. 6F is a schematic perspective view of a three-dimensional structure comprising the structure of FIG. 6E and one additional attached substructure, according to an exemplary method of the present disclosure.

Referring to FIGS. 6A-6F, FIG. 6A shows a first substructure 1 having a cylindrical shape. The first substructure 1 comprises 3 major surfaces $S_1$ through $S_3$. FIG. 6B shows seven attached substructures of a three-dimensional structure 6000*b*, in which the substructures 2 through 7 are attached to the vertical walls of the first substructure 1, surrounding the first substructure 1. The substructures 2 through 7 each have a partial cylindrical shape. FIG. 6C shows a three-dimensional structure 6000*c* comprising the structure 6000*b* of FIG. 6B and further comprising an eighth substructure 8 disposed on top of a major surface of the first substructure 1. FIG. 6D shows a three-dimensional structure 6000*d* comprising the structure 6000*c* of FIG. 5C and further comprising fourteen additional substructures (i.e., substructures 9 through 22) attached to the vertical walls of the substructures 2 through 7. FIG. 6E shows a three-dimensional structure 6000*e* comprising the structure 6000*d* of FIG. 6D and further comprising six additional substructures (i.e., substructures 23 through 28) attached to the vertical walls of the eighth substructure 8, surrounding the eighth substructure 8. FIG. 6F shows a three-dimensional structure 6000*f* comprising the structure 6000*e* of FIG. 6E and further comprising a twenty-ninth substructure 29 disposed on top of a major surface of the eighth substructure 8. Accordingly, per the exemplary methods of making a three-dimensional structure according to the present disclosure, the substructures 9 through 22 were formed prior to the substructures 23 through 28 to minimize clipping during formation of the substructures 9 through 22 due to the presence of the substructures 23 through 28 that are located vertically disposed between a microscope objective (not shown) during formation and the substructures 2 through 7.

An alternate potential solution to the problem of incomplete curing due to clipping would be to form all of the substructures of a first, bottom layer, followed by forming all of the substructures of a second layer directly on top of a major surface of the first layer, then followed by forming of the substructure of a third layer directly on top of a major surface of the second layer. A challenge associated with this approach, however, was discovered: it is difficult to maintain surface location control when forming arrays of substructures over long periods of time, such as the amount of time required to form an entire layer before forming any substructures of another layer vertically disposed on the prior layer. For instance, long after a base layer of a structure is formed, the beam most likely has moved due to temperature fluctuations. Relocating a reference location surface is not possible because the base layer is formed on the reference location surface. In certain embodiments, no more than twenty individual substructures are formed before forming a substructure directly attached to a previously formed substructure, no more than nineteen substructures, no more than eighteen substructures, no more than seventeen substructures, no more than sixteen substructures, or no more than fifteen substructures are formed before forming a substructure directly attached to a previously formed substructure. This assists in minimizing drift of the beam before returning to form another substructure directly attached to a previously formed substructure.

Depending on the respective shapes of the plurality of substructures, each of the plurality of substructures optionally has at least one vertical wall directly attached to the vertical wall of an adjacent substructure, at least two vertical walls, at least three vertical walls, at least four vertical walls, at least five vertical walls, or even at least six vertical walls directly attached to the vertical walls of at least one adjacent substructure.

Figure 7A:
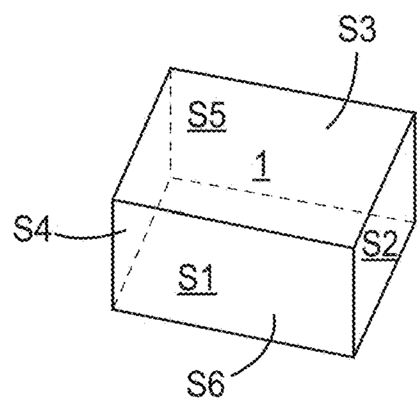
FIG. 7A is a schematic perspective view of a substructure according to the present disclosure.
Figure 7B:
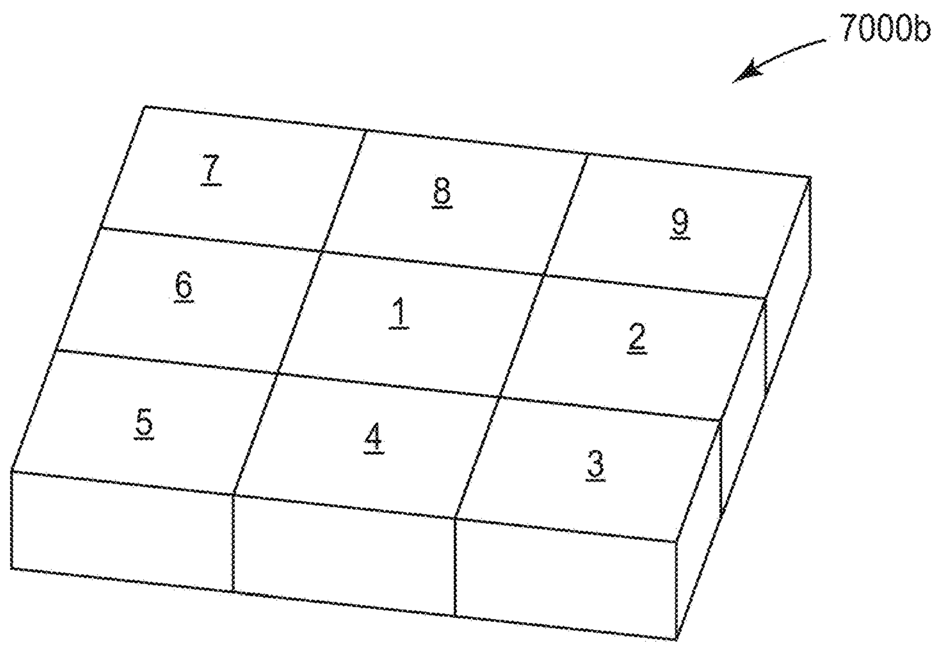
FIG. 7B is a schematic perspective view of nine attached substructures of a three-dimensional structure according to the present disclosure.
Figure 7C:
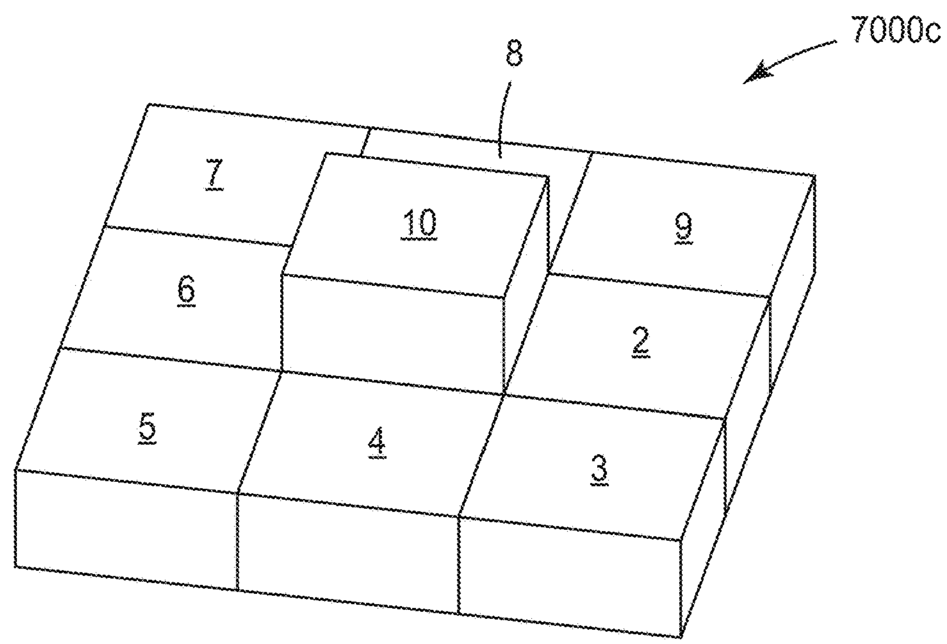
FIG. 7C is a schematic perspective view of the structure of FIG. 7B further comprising a tenth substructure, according to an exemplary method of the present disclosure.
Figure 7D:
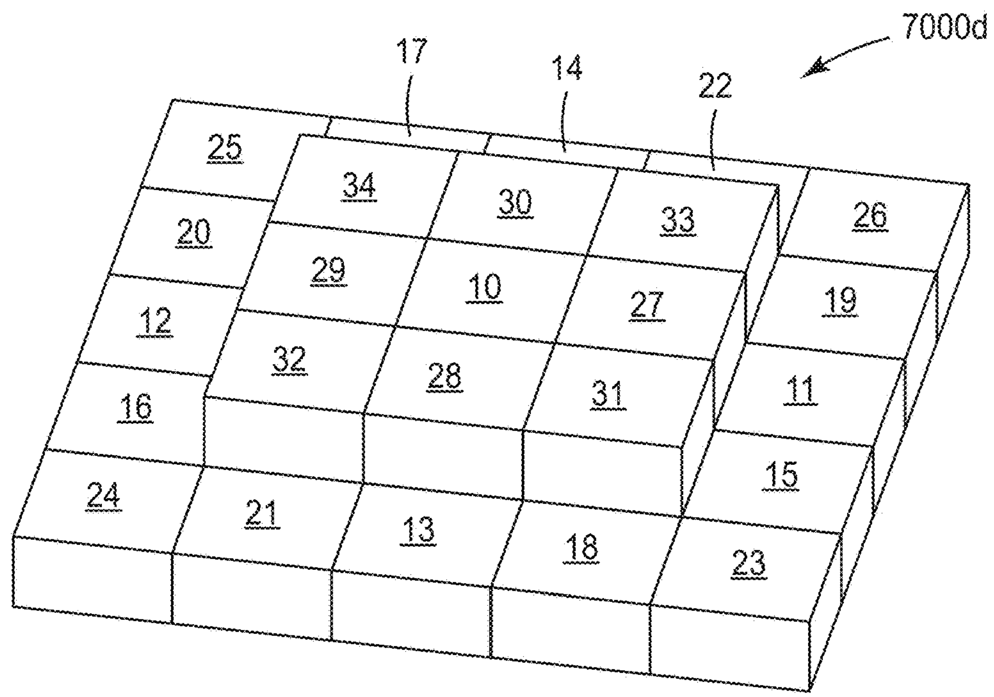
FIG. 7D is a schematic perspective view of a three-dimensional structure comprising the structure of FIG. 7C and twenty-four additional attached substructures, according to an exemplary method of the present disclosure.
Figure 7E:
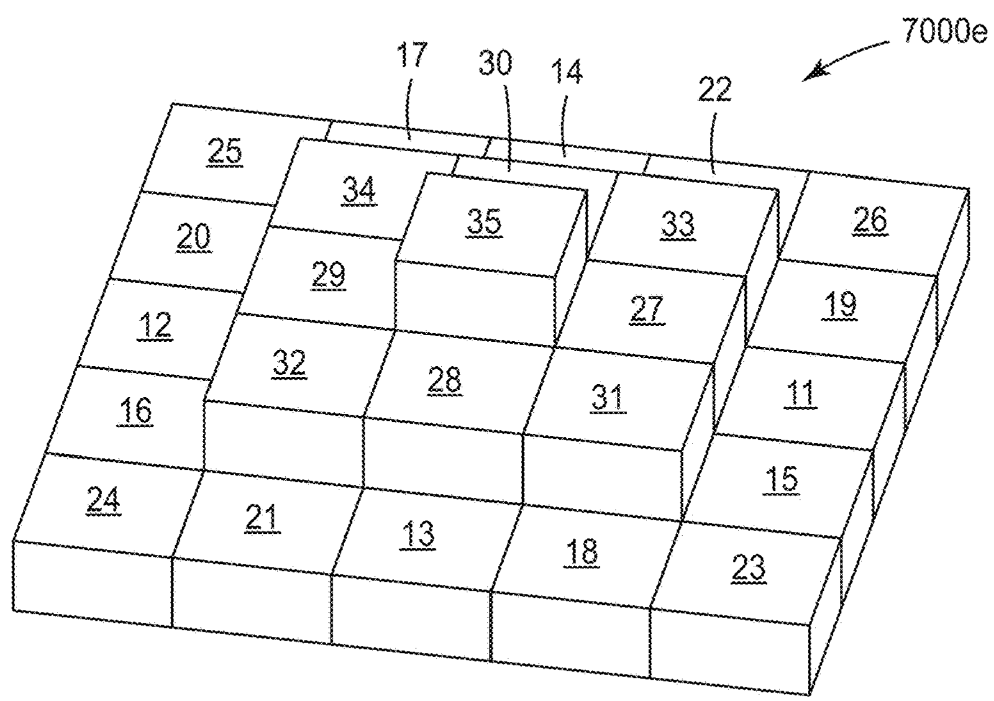
FIG. 7E is a schematic perspective view of a three-dimensional structure comprising the structure of FIG. 7D and one additional attached substructure, according to an exemplary method of the present disclosure.

Referring to FIGS. 7A-7E, FIG. 7A shows a first substructure 1 having a cuboid shape. The first substructure 1 comprises 6 major surfaces $S_1$ through $S_6$. FIG. 7B shows nine attached substructures of a three-dimensional structure 7000*b*, in which the substructures 2 through 9 are attached to the vertical walls of the first substructure 1, surrounding the first substructure 1. In certain embodiments, the first substructure is located at substantially a center of a major surface of the structure. FIG. 7C shows a three-dimensional structure 7000*c* comprising the structure 7000*b* of FIG. 7B and further comprising a tenth substructure 10 disposed on top of a major surface of the first substructure 1. FIG. 7D shows a three-dimensional structure 7000*d* comprising the structure 7000*c* of FIG. 7C and further comprising twenty-four additional substructures (i.e., substructures 11 through 34) attached to the vertical walls of the substructures 2 through 10. FIG. 7E shows a three-dimensional structure 7000*e* comprising the structure 7000*d* of FIG. 7D and further comprising a thirty-fifth substructure 35 disposed on top of a major surface of the tenth substructure 10. Accordingly, per the exemplary methods of making a three-dimensional structure according to the present disclosure, the substructures 11 through 26 were formed prior to the substructures 27 through 34 to minimize clipping during formation of the substructures 11 through 26 due to the presence of the substructures 27 through 34 that are located vertically disposed between a microscope objective (not shown) during formation and the substructures 2 through 9.

Figure 8:
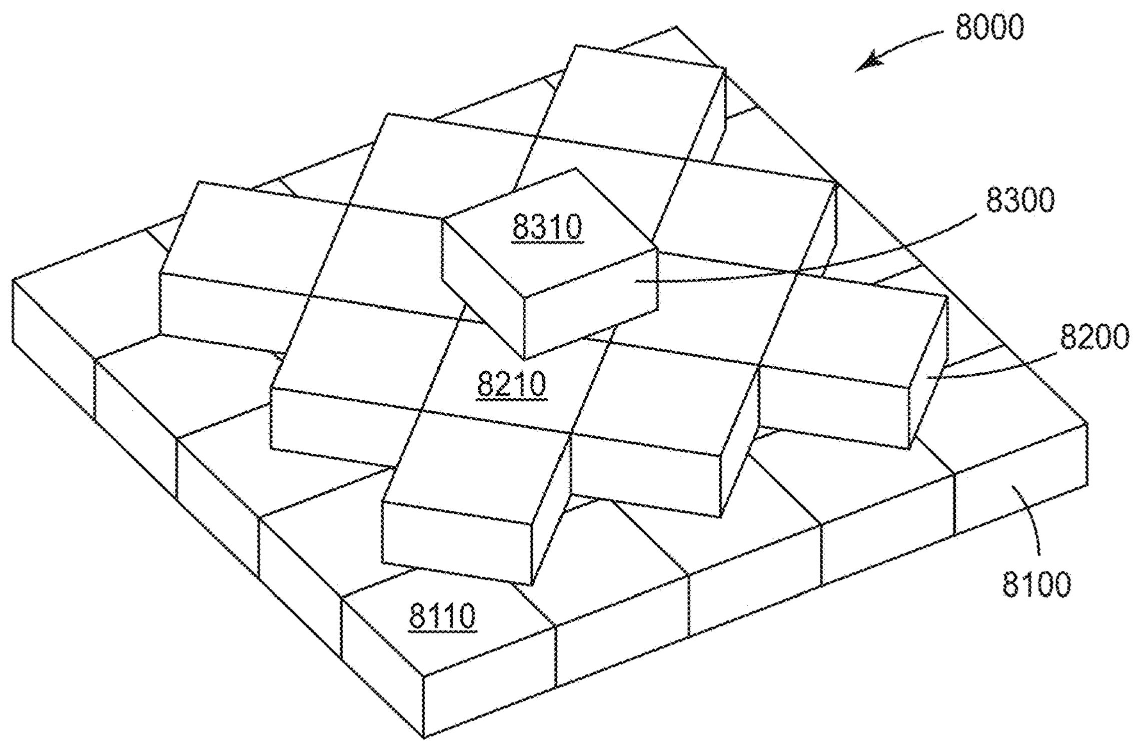
FIG. 8 is a schematic perspective view of a three-dimensional structure comprising three layers of substructures, according to an exemplary method of the present disclosure.

Referring to FIG. 8, in some embodiments, a three-dimensional structure 8000 is formed of a plurality of substructures each having the same shape but oriented in various relative rotations with respect to each other. More particularly, the structure 8000 comprises a first layer 8100 comprising a plurality of first substructures 8110, a second layer 8200 comprising a plurality of second substructures 8210 disposed on top of the first layer 8100, and a third layer 8300 comprising at least one third substructure 8310 disposed on a major surface of the second layer 8200. Each of a substructure 8310 and a substructure 8110 is shown oriented at a 45 degree angle to a substructure 8210, hence the alternating layers of the structure 8000 have substructures oriented at different angles.

Referring again to FIG. 3A, a structure can be designed such that at least one of its substructures has a height that is a fraction of a focal length of the laser light, to decrease the opportunity for clipping of substructures as they are formed near other already formed substructures. For instance, in some embodiments of methods described herein, at least one of the plurality of substructures of a structure has a height that is 1% or greater of a focal length of the laser light, 2% or greater, 3% or greater, 4% or greater, 5% or greater, 6% or greater, 7% or greater, 8% or greater, or 9% or greater; and 25% or less, 23% or less, 21% or less, 20% or less, 18% or less, 15% or less, 13% or less, 12% or less, or 10% or less. Stated another way, at least one of the plurality of substructures has a height that is 1% to 25% of a focal length of the laser light, 1% to 20%, 1% to 15%, 1% to 10%, or 2% to 10% of the focal length of the laser light.

Exemplary Embodiments

Embodiment 1 is a method of making a three-dimensional structure including a plurality of substructures. The method includes directing laser light from a microscope objective through a photopolymerizable material to form a plurality of substructures each having at least one vertical wall directly attached to a vertical wall of an adjacent substructure. The substructures are individually formed in a sequence such that any second substructure that is formed in a location vertically disposed between the microscope objective and a first substructure has a wall that extends horizontally a shorter distance than a wall of the first substructure if a third substructure will subsequently be formed directly attached to the wall of the first substructure.

Embodiment 2 is the method of embodiment 1, wherein at least one of the plurality of substructures has a height that is 1% to 25% of a focal length of the laser light, 1% to 20%, 1% to 15%, 1% to 10%, or 2% to 10% of the focal length of the laser light.

Embodiment 3 is the method of embodiment 1 or embodiment 2, wherein each of the plurality of substructures has at least two vertical walls, at least three vertical walls, or at least four vertical walls directly attached to the vertical walls of at least one adjacent substructure.

Embodiment 4 is the method of any of embodiments 1 to 3, wherein no more than twenty individual substructures are formed before forming a substructure directly attached to a previously formed substructure.

Embodiment 5 is the method of any of embodiments 1 to 4, wherein the first substructure includes at least three major surfaces, four major surfaces, at least five major surfaces, or at least six major surfaces.

Embodiment 6 is the method of any of embodiments 1 to 5, wherein the first substructure has a cuboid shape, a cylindrical shape, a hexagonal prismatic shape, or a triangular prismatic shape.

Embodiment 7 is the method of any of embodiments 1 to 6, wherein the first substructure is located at substantially a center of a major surface of the structure.

Embodiment 8 is the method of any of embodiments 1 to 7, wherein the first substructure is located at an edge of a major surface of the structure.

Embodiment 9 is the method of any of embodiments 1 to 8, wherein the photopolymerizable material is a liquid comprising a multiphoton absorber and a polymerizable compound.

Embodiment 10 is the method of embodiment 9, wherein the laser light is directed under conditions such that multiphoton absorption by the multiphoton absorber occurs, and at least partial polymerization of the polymerizable compound occurs.

Embodiment 11 is the method of any of embodiments 1 to 10, wherein at least one vertical wall has a height that is the same as the vertical wall of the directly attached adjacent substructure.

Embodiment 12 is the method of any of embodiments 1 to 11, including a first layer containing the first substructure and the third substructure and a second layer containing the second substructure, wherein the second layer is disposed on a major surface of the first layer.

Embodiment 13 is the method of embodiment 12, further including a third layer disposed on a major surface of the second layer.

Embodiment 14 is the method of embodiment 12 or embodiment 13, including forming at least one substructure of the second layer prior to completing a final substructure of the first layer.

EXAMPLES

Objects and advantages of this disclosure are further illustrated by the following examples, but the particular materials and amounts thereof recited in these examples, as well as other conditions and details, should not be construed to unduly limit this disclosure. Unless otherwise noted or otherwise apparent from the context, all parts, percentages, ratios, etc. in the Examples and the rest of the specification are by weight.

A section of a 4 inch (10.16 cm) diameter silicon wafer (purchased from WRS Materials, LLC., San Jose, Calif.) was overlaid with a square cut section of sandblast stencil material (from 3M Company, St, Paul, Minn.) to create an interior reservoir, in which was poured liquid resin of the following composition: 65 parts by weight ERL4221 3,4-epoxycyclohexylmethyl 3,4-epoxycyclohexylcarboxylate (from Polysciences, Inc., Warrington, Pa.); 35 parts by weight of SR351 trimethylolpropane triacrylate (from Sartomer Co., Exton, Pa.); 0.5 part by weight of 2,5-bis[4-(diphenylamino)stryl]-1-(2-ethylhexyloxy)-4-methoxybenzene (KL68) photosensitizer (synthesized as described in U.S. Pat. No. 7,265,161 (Leatherdale et al.)); and 1.0 percent by weight of PC-2506 diaryliodonium hexafluoroantimonate (from Polyset Co., Mechanicville, N.Y.).

Immersed into the reservoir of resin was a Nikon 20×/0.4 water immersion objective (available from Nikon Instruments Inc., Melville, N.Y.), through which structures were formed using a galvo based laser scanning system, wherein the laser source used was a Mai Tai ultrafast laser (800 nanometer wavelength, <100 femtosecond pulse length, 80 megahertz repetition rate, available from Spectra-Physics, Santa Clara, Calif.). The power used was 15 mW, with a scan rate of 90 mm/s.

Comparative Example 1

A structure of Comparative Example 1 is shown in FIG. 1B, including substructures 1 to 30 each configured to have a size of 200 micrometers×200 micrometers in a XY dimension and 200 micrometers in a Z dimension. The substructures were formed sequentially in the order shown in FIG. 1B to build a wall section 1000*b* that is approximately 1200 micrometers long, 200 micrometers deep, and 1000 micrometers tall. Incomplete structure formation 140 can be seen at the base of each substructure 6 through 9, 11 through 14, 16 through 19, 21 through 24, and 26 through 29, formed subsequent to a previous structure in which the focus beam experienced where the laser light beam passed through an area with non-uniform refractive indices, and the beam was refracted, resulting in decreased energy at the focal point.

Example 1

Figure 9:
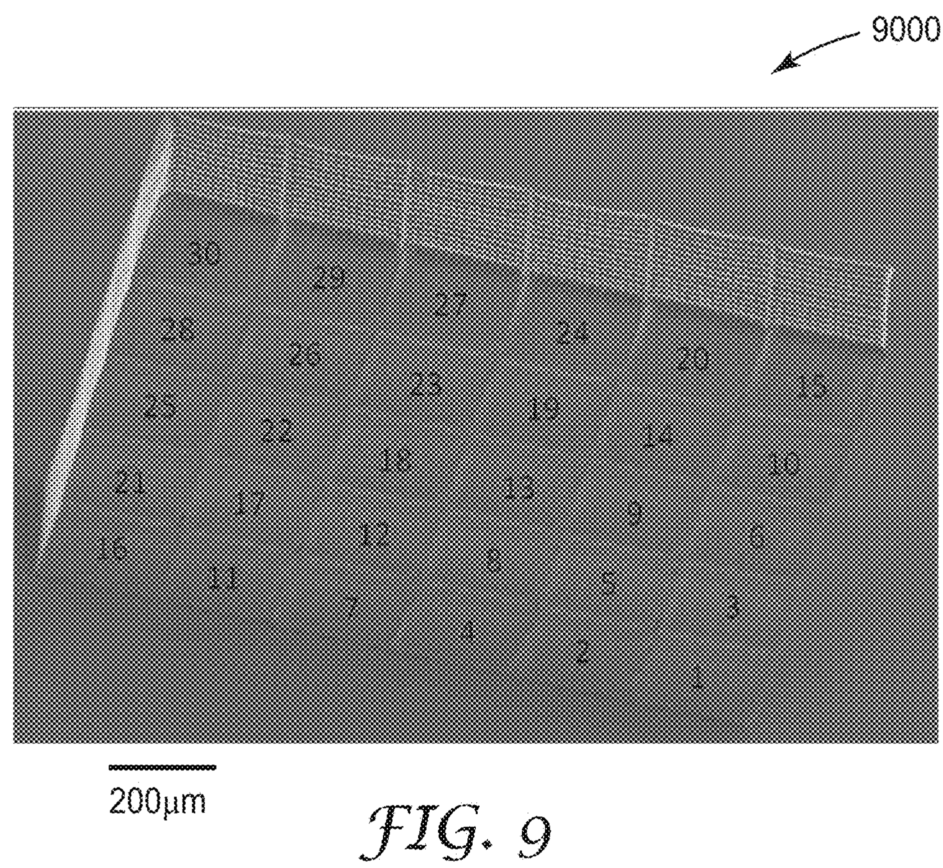
FIG. 9 is a scanning electron microscopy (SEM) image of the exemplary structure of Example 1 according to an exemplary method of the present disclosure.

A structure of Example 1 is shown in FIG. 9, including substructures 1 to 30 each configured to have a size of 200 micrometers×200 micrometers in a XY dimension and 200 micrometers in a Z dimension. The substructures were formed sequentially in the order shown in FIG. 9 to build a wall section 9000 that is 1200 micrometers long, 200 micrometers deep, and 1000 micrometers tall, following a bricklaying approach (e.g., as described above). A significantly improved overall structure quality is shown.

Foreseeable modifications and alterations of this disclosure will be apparent to those skilled in the art without departing from the scope and spirit of this invention. This invention should not be restricted to the embodiments that are set forth in this application for illustrative purposes.

What is claimed is:

1. A method of making a three-dimensional structure comprising a plurality of substructures, the method comprising: directing laser light from a microscope objective through a photopolymerizable material to form a plurality of substructures each having at least one vertical wall directly attached to a vertical wall of an adjacent substructure;

wherein the substructures are individually formed in a sequence such that any second substructure that is formed in a location vertically disposed between the microscope objective and a first substructure has a vertical wall that extends horizontally a shorter distance than a vertical wall of the first substructure when a third substructure will subsequently be formed directly attached to the vertical wall of the first substructure.

2. The method of claim 1, wherein at least one of the plurality of substructures has a height that is 1% to 25% of a focal length of the laser light, 1% to 20%, 1% to 15%, 1% to 10%, or 2% to 10% of the focal length of the laser light.

3. The method of claim 1, wherein each of the plurality of substructures has at least two vertical walls, at least three vertical walls, or at least four vertical walls directly attached to the vertical walls of at least one adjacent substructure.

4. The method of claim 1, wherein no more than twenty individual substructures are formed before forming a substructure directly attached to a previously formed substructure.

5. The method of claim 1, wherein the first substructure comprises at least three major surfaces, at least four major surfaces, at least five major surfaces, or at least six major surfaces.

6. The method of claim 1, wherein the first substructure has a cuboid shape, a cylindrical shape, a hexagonal prismatic shape, or a triangular prismatic shape.

7. The method of claim 1, wherein the first substructure is located at a center of a major surface of the structure.

8. The method of claim 1, wherein the first substructure is located at an edge of a major surface of the structure.

9. The method of claim 1, wherein the photopolymerizable material is a liquid comprising a multiphoton absorber and a polymerizable compound.

10. The method of claim 9, wherein the laser light is directed under conditions such that multiphoton absorption by the multiphoton absorber occurs, and at least partial polymerization of the polymerizable compound occurs.

11. The method of claim 1, wherein at least one vertical wall has a same height as the vertical wall of the directly attached adjacent substructure.

12. The method of claim 1, comprising a first layer comprising the first substructure and the third substructure and a second layer comprising the second substructure, wherein the second layer is disposed on a major surface of the first layer.

13. The method of claim 12, further comprising a third layer disposed on a major surface of the second layer.

14. The method of claim 12, comprising forming at least one substructure of the second layer prior to completing a final substructure of the first layer.

* * * * *